United States Patent
Rankin

(10) Patent No.: US 6,792,579 B2
(45) Date of Patent: Sep. 14, 2004

(54) SPICE TO VERILOG NETLIST TRANSLATOR AND DESIGN METHODS USING SPICE TO VERILOG AND VERILOG TO SPICE TRANSLATION

(75) Inventor: Andrew Rankin, Fort Collins, CO (US)

(73) Assignee: LSI Logic Corporation, Milpitas, CA (US)

(*) Notice: Subject to any disclaimer, the term of this patent is extended or adjusted under 35 U.S.C. 154(b) by 58 days.

(21) Appl. No.: 09/972,100

(22) Filed: Oct. 5, 2001

(65) Prior Publication Data

US 2003/0084410 A1 May 1, 2003

(51) Int. Cl.⁷ .............................................. G06F 17/50
(52) U.S. Cl. .................................. 716/3; 716/1; 716/4
(58) Field of Search .................................... 716/3, 1, 4

(56) References Cited

U.S. PATENT DOCUMENTS

| | | | | |
|---|---|---|---|---|
| 5,581,562 A | * | 12/1996 | Lin et al. ..................... | 714/724 |
| 5,838,947 A | * | 11/1998 | Sarin ........................... | 703/14 |
| 5,848,263 A | * | 12/1998 | Oshikiri ........................ | 716/3 |
| 6,470,482 B1 | * | 10/2002 | Rostoker et al. ............... | 716/6 |
| 6,496,955 B1 | * | 12/2002 | Chandra et al. ................ | 716/3 |
| 6,499,129 B1 | * | 12/2002 | Srinivasan et al. ............. | 716/4 |
| 6,526,562 B1 | * | 2/2003 | Haddad et al. ................ | 716/18 |

OTHER PUBLICATIONS

Piguet et al., Gate–Array and ASIC Standard Cell Libraries, Technology Leadership Data 200, HES Fribourg, pates 1–8, Oct. 2001.*

S. Zebardst et al., SP2V: Accelerating Post–Layout Spice Simulation Using Verilog Gate–Level Modeling. Canadian Conference on Electrical and Computer Engineering, vol. 1, pp. 253–257, May 2001.*

M. Naum et al., Automatic Functional Model Validation Between Spice and Verilog, 30th Industry Applications Conference, pp. 1076–1083, Oct. 1995.*

Kobayashi et al., ST: PERL package for Simulation and Test Environment, 2001 IEEE Internations Symposium on Circuits and Systems, pp. 89–92, May 2001.*

* cited by examiner

*Primary Examiner*—A. M. Thompson
(74) *Attorney, Agent, or Firm*—Cochran Freund & Young LLC

(57) ABSTRACT

Disclosed is a method for translating a SPICE format circuit description to Verilog format and design method employing Verilog to SPICE and SPICE to Verilog translation, allowing simulation in Verilog or SPICE formats and allowing verification of Verilog to SPICE translation. SPICE to Verilog translation may employ identification of SPICE sub circuits, circuit elements, input signals, and output signals; and translation of these to Verilog format wherein signal names and design hierarchy can be maintained. Circuit element instance names may be translated to Verilog names associated with SPICE instance names. Identification and translated may employ lookup tables, rule sets, specialized filed delimiters, naming conventions, or combinations thereof. An intermediate file of input and output signals may be created. SPICE node names may be converted to Verilog wire definitions.

18 Claims, 5 Drawing Sheets

SPICE TO VERILOG NETLIST TRANSLATOR AND DESIGN METHODS USING SPICE TO VERILOG AND VERILOG TO SPICE TRANSLATION

BACKGROUND OF THE INVENTION a. Field of the Invention

The present invention pertains to integrated circuit development software and more specifically to translating a circuit description employing a SPICE format to that of a Verilog format.

b. Description of the Background

Integrated circuit design may be custom or semi-custom. Semi-custom may employ gate array or standard cell methodologies. Gate array employs a base set of functions fabricated on a semiconductor die that are later interconnected to reflect the function of the design. Interconnection may employ metal, polysilicon or other layers. Standard cell employs a predefined set of cells exhibiting a common dimension that may be placed in rows and blocks, the order determined by functions to be implemented and routing of interconnect between cells or groups of cells. Verilog, a hardware description language, is frequently employed in the design process. Verilog may be used to specify the initial design, to provide input to synthesis tools, and to check post layout operation. At times, the predefined set of cells of a standard cell library may not provide a desired function, or may not provide the speed, size, or power consumption desired. In these circumstances, new cells may be created, or a custom block of logic incorporating the desired function may be designed. The design of the custom block of logic may employ SPICE (Special Programs for Interactive Circuit Elements) to specify and simulate the design. SPICE supports both logical and timing simulation. In order to simulate the whole design that comprises Verilog and SPICE defined elements, Verilog must be converted to SPICE or SPICE must be converted to Verilog. A number of simulation tools require a SPICE format input and tools are provided to convert Verilog to SPICE such that the whole design may be simulated using SPICE. There are not tools that provide SPICE to Verilog conversion, as may be employed to verify Verilog to SPICE conversion, or to allow simulation of a design in Verilog for those simulation tools that support Verilog formats. Further, changes made to SPICE designs are not easily verified. Therefore a new method to convert a SPICE netlist to a Verilog netlist is needed.

SUMMARY OF THE INVENTION

The present invention overcomes the disadvantages and limitations of the prior art by providing a system and method of translating a SPICE netlist to Verilog. By mapping SPICE constructs to Verilog constructs, and by mapping SPICE syntax to Verilog syntax, the present invention provides an easy to use, automatic conversion program. Advantageously, the present invention allows SPICE based designs to be converted to Verilog to confirm the accuracy of prior conversion from Verilog to SPICE. SPICE may be required as a simulation input format for some simulation tools. Such tools may be employed to simulate circuits comprising semi-custom and custom components, and may also be employed to simulate circuits comprising analog and digital circuitry, as may be employed in communication systems.

The present invention therefore may comprise a method for designing an integrated circuit comprising: partitioning a design into a plurality of function blocks; designing a first one of the plurality of function blocks employing Verilog to produce a first block design; designing a second one of the plurality of function blocks employing SPICE to produce a second block design; converting the first block design to SPICE to produce a converted first block design; simulating operation of the converted first block design and the second block design; and translating the converted first block design to Verilog to produce a translated first block design.

The present invention provides flexibility in the format of simulation such that SPICE designs may be converted to Verilog and simulated in Verilog. Such simulation may comprise testing and fault coverage analysis. Further, a SPICE file that is converted to Verilog may be used as stimulus to another block that is being designed, allowing design and simulation to occur in a single format. Advantageously, the circuit and signal names of the SPICE file may be retained, or may be translated to a form readily associable with the original names such that translated files may easily be compared with the SPICE source file. The hierarchy of the SPICE description may also be maintained, allowing simplified review of circuit structure The invention therefore may further comprise a method for translating a SPICE netlist to Verilog comprising: opening a SPICE file; translating ".SUBCKT" instantiations to "module"; translating ".ENDS" statements to "endmodule"; translating SPICE circuit elements to Verilog format; and removing discrete circuit elements.

The present advantage provides the flexibility of format that allows developers to employ a wider range of simulation tools while maintaining verification of the converted design. The method of the present invention may be employed in a batch process, providing automatic conversion. The aforementioned flexibility of format may allow greater utilization of resources by providing a choice to simulate using SPICE or to simulate using Verilog.

DESCRIPTION OF THE FIGURES

In the figures.

DETAILED DESCRIPTION OF THE INVENTION

Figure 1:
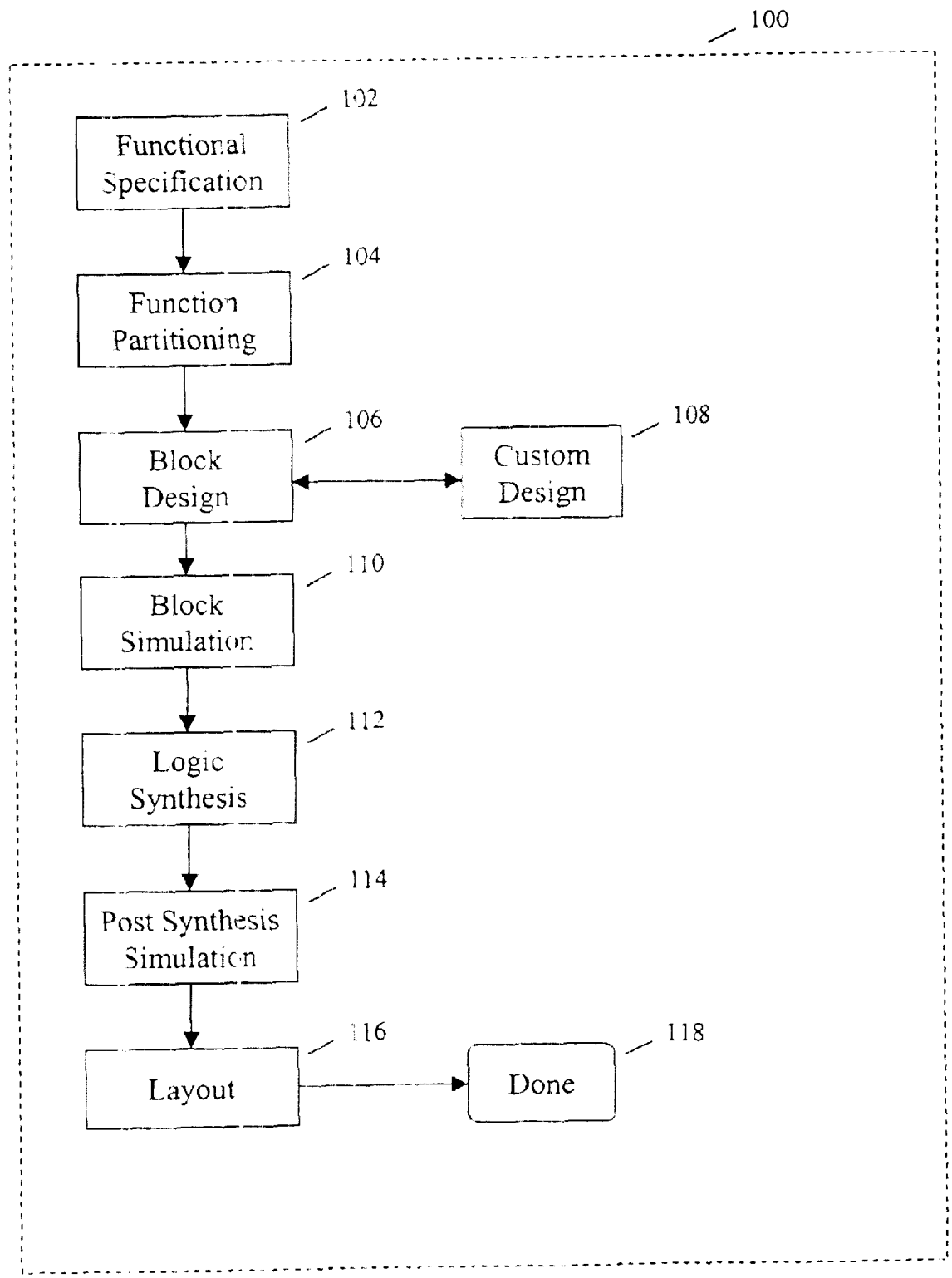
FIG. 1 is an overview of a design process according to a representative embodiment of the invention.

FIG. 1 is an overview of an integrated circuit design process. Process 100 begins at step 102 where a function specification for a design is received. At step 104, the design may be partitioned into functional blocks. At step 106, logic design of the blocks partitioned in step 104 is performed. Logic design may employ pre-defined circuits such as counters and registers that are provided with a design library. Logic design may employ a hardware descriptive language such as Verilog. Verilog is a Hardware Description Language; a textual format for describing electronic circuits and systems. Applied to electronic design, Verilog may be used for verification through simulation, for timing analysis, for test analysis (testability analysis and fault grading) and for logic synthesis. Verilog HDL is an IEEE standard—number 1364. Through Verilog, the designer may select circuit elements and define the interconnection between elements. At step 106, it may be determined that custom design is desired to meet a design goal such as speed, power, circuit size, or other parameter. Custom design may be performed at step 108 and may employ software simulation tools such as SPICE. Once a design for one block or a plurality of blocks is completed, the process advances to step 110 where the design is simulated. At step 110, Verilog files may be converted to SPICE to allow simulation with custom logic. Simulation may employ a stimulus file that provides a sequence of input signals, allowing the designer to check operation of the block or blocks. The steps of block design 106, custom design 108, and simulation 110 may be reiterative in that a design may be altered to correct errors or to achieve implementation goals. At step 112, the design may be synthesized wherein the circuit description provided through Verilog or other hardware descriptive language is converted to logic gates. The logic gates may be selected from a logic library such as a standard cell library. For each type of function defined in the design, such as AND, OR and other gates, there are commonly a plurality of versions of each function wherein versions may vary in speed, power, output drive, or other characteristics. Post synthesis simulation 114 may employ SPICE values for custom logic and may employ parameters associated with the logic gates selected in step 112 to provide a more accurate estimation of performance. The step 114 simulation may include comparison with design goals and may result in repetition of previous steps to meet design goals. The process then continues at step 116 where routing and physical layout of the design is performed. Post layout simulations (not depicted) may be performed to confirm correct design operation. The process ends at step 118.

Figure 2:
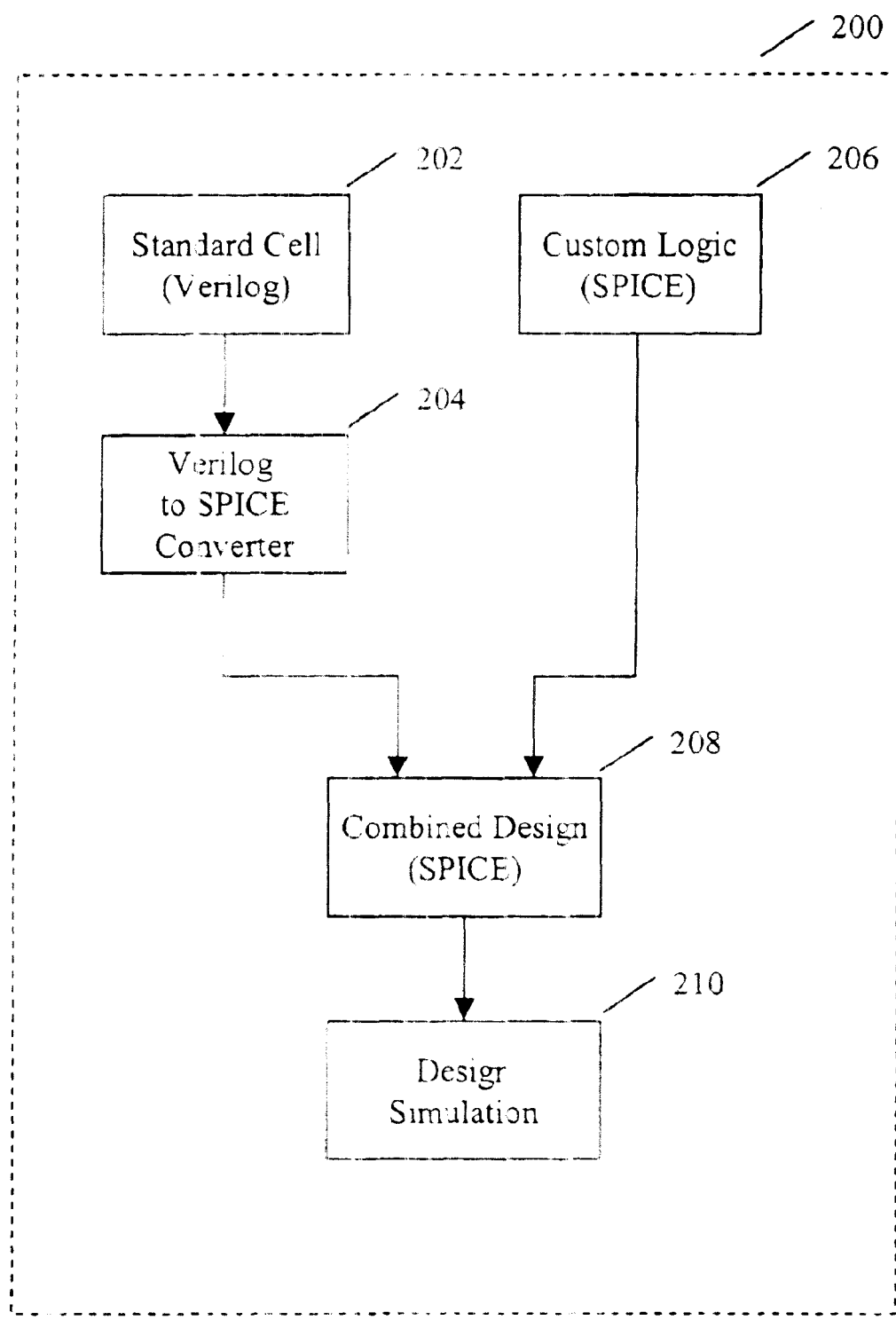
FIG. 2 depicts Verilog to SPICE conversion and combined design simulation using SPICE.

FIG. 2 depicts Verilog to SPICE conversion and combined design simulation using SPICE. Verilog design 202 is input to Verilog to SPICE converter 204. Verilog to SPICE converter 204 may employ software such as v21vs from Mentor Graphics Corporation that has headquarters at 8005 SW Boeckman Road, Wilsonville, Oreg. 97070. Custom design 206, in a SPICE format, may be combined with the output of Verilog to SPICE converter 204 to produce combined design 208 that then may be simulated in SPICE format at step 210. Simulation 210 may employ programs such as Timemill from Synopsys Corporation, headquartered at 700 East Middlefield Rd. Mountain View, Calif. 94043. Simulation 210 may comprise analog, digital or mixed signal simulation.

Figure 3:
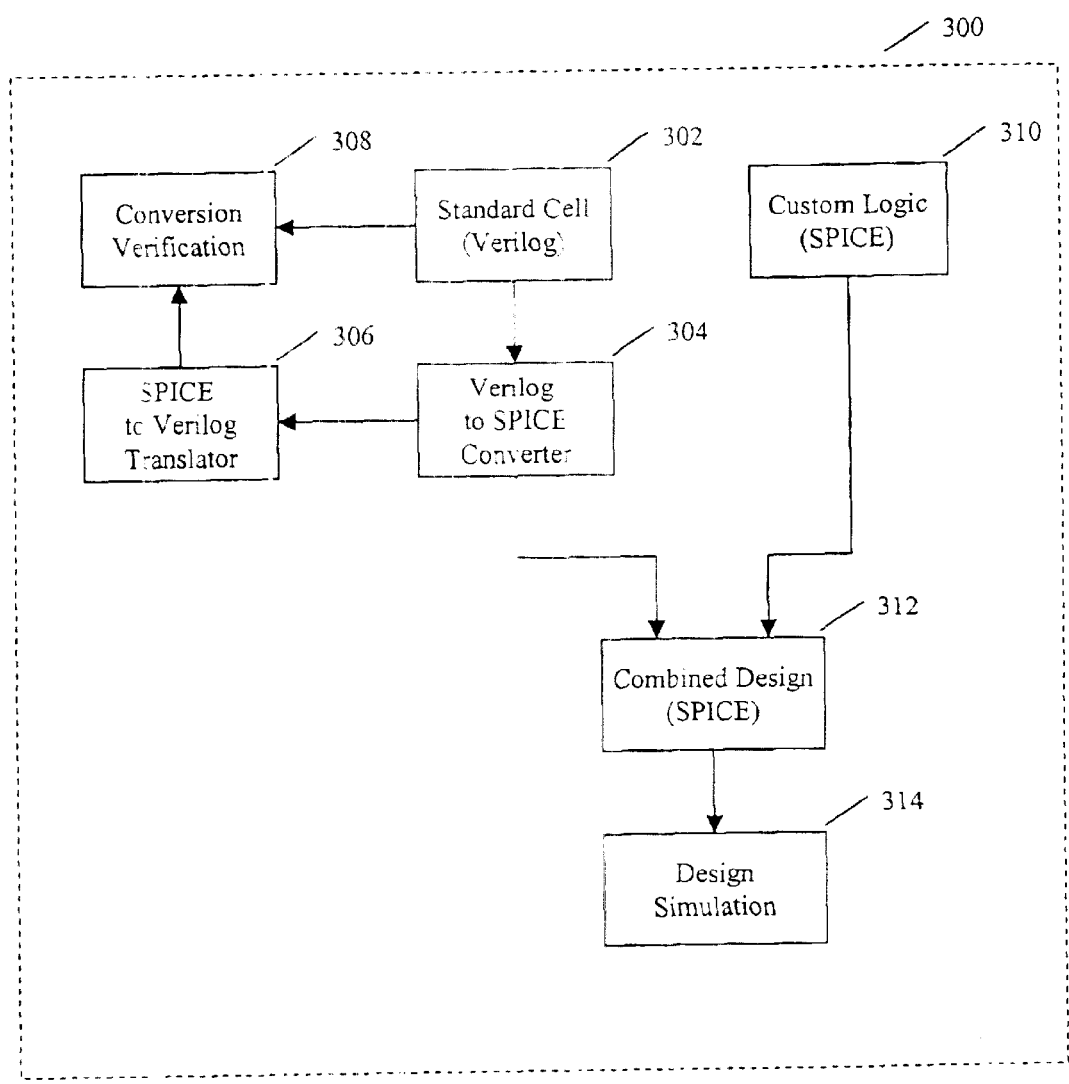
FIG. 3 depicts Verilog to SPICE conversion, SPICE to Verilog translation for verification, and combined design simulation using SPICE.

FIG. 3 depicts Verilog to SPICE conversion, SPICE to Verilog translation for verification, and combined design simulation using SPICE. Verilog design 302 is input to Verilog to SPICE converter 304. Custom design 310, in a SPICE format, may be combined with the output of Verilog to SPICE converter 304 to produce combined design 312 that may be simulated in SPICE format at step 314. The output of Verilog to SPICE converter 304 may be input to SPICE to Verilog translator 306. Verilog design 302 and the output of SPICE to Verilog translator 306 are supplied to conversion verification 308 where the accuracy of Verilog to SPICE conversion may be checked.

Figure 4:
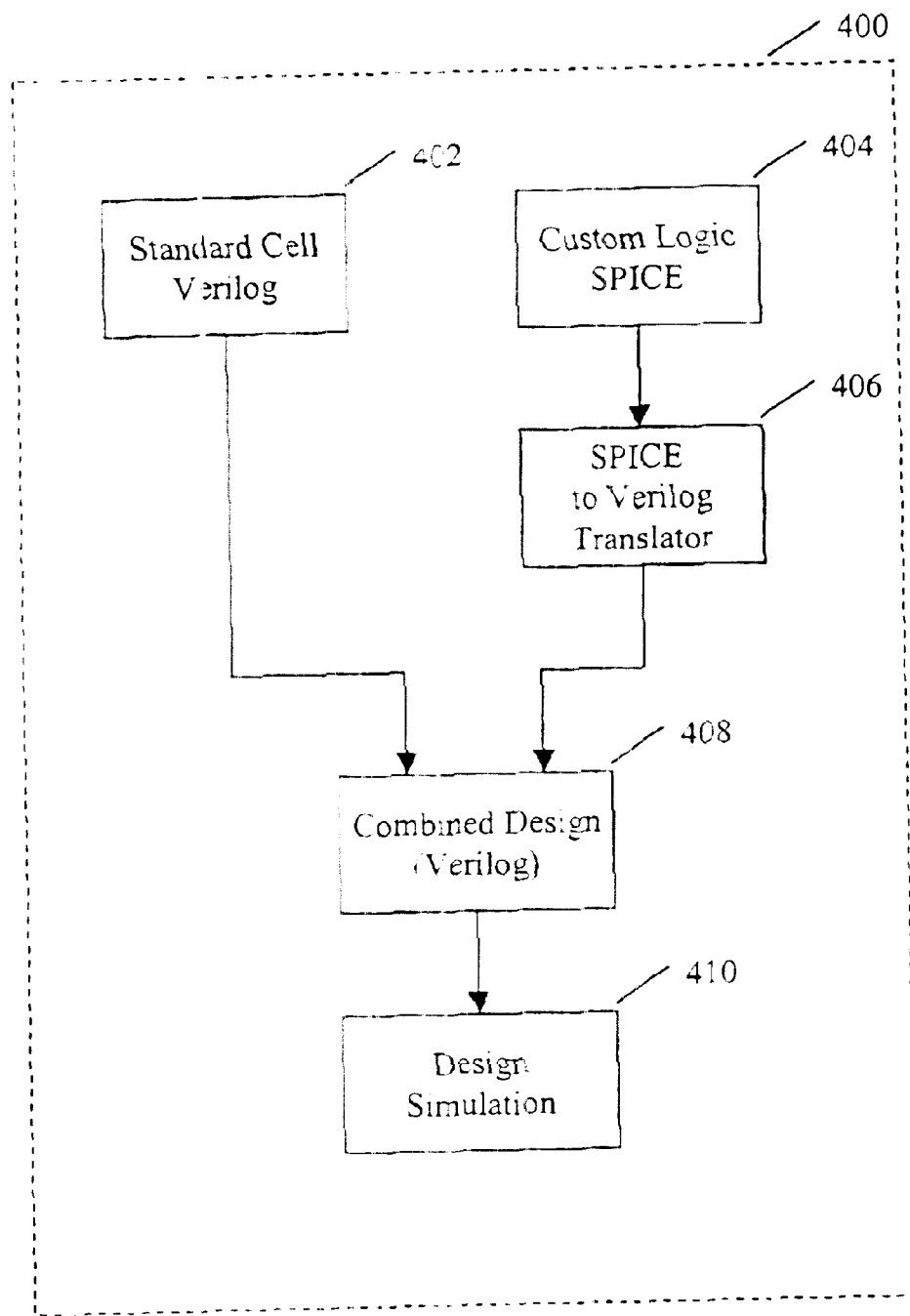
FIG. 4 depicts SPICE to Verilog translation and combined design simulation using Verilog.

FIG. 4 depicts SPICE to Verilog translation and combined design simulation using Verilog. Custom logic 404, in SPICE format, is input to SPICE to Verilog translator 406. Verilog design 402 is combined with the output from SPICE to Verilog translator 406 to produce combined design 408 that may be simulated in Verilog format at step 410.

Figure 5:
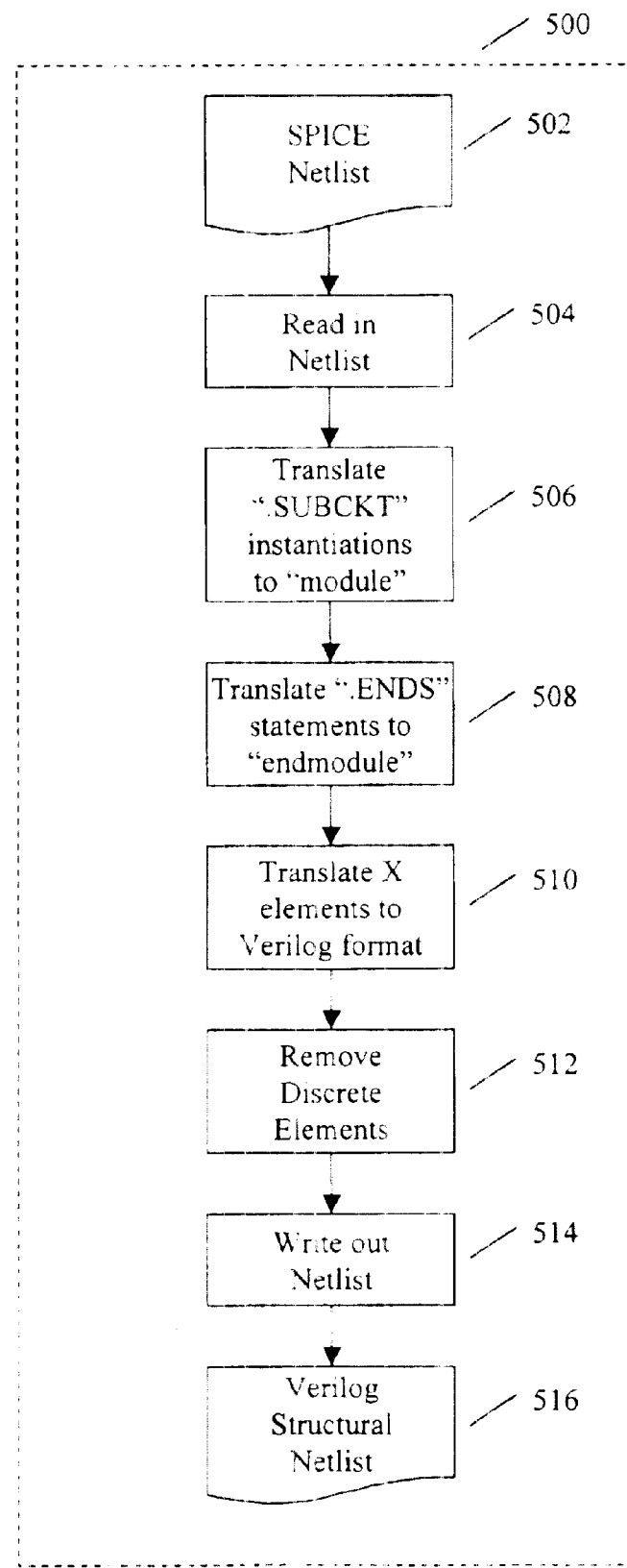
FIG. 5 is a flowchart of a SPICE to Verilog translation process.

FIG. 5 is a flowchart of a SPICE to Verilog translation process. The translation process 500 begins with SPICE netlist 502 that is opened and read in at step 504. Table 1 below lists an example SPICE file input and Table 2 below lists an example Verilog file output. At step 506, instantiations of the heading "SUBCKT" are translated to "module". A circuit name, and input and output signal names, may follow the "SUBCKT" heading. The circuit name may be identified as the first work following "SUBCKT" and may be utilized as the module name. Input and output signal names follow the circuit name and may be may be employed in the Verilog output file. For example, the "SUBCKT INV_CHAIN Z A" line of table 1 may be employed to generate the "module INV_CHAIN (Z, A)" entry listed in table 2. Retaining the circuit name and input and output signal names allows simplified association of the SPICE input file with the Verilog output file. Alternately, new circuit and signal names may be introduced in the translation process. At step 508, "ENDS" statements are translated to "endmodule". At step 510, "x" elements are translated to Verilog format. The 'x' elements may comprise an instance name, signal nodes, and a circuit element descriptor. For example, the "XINV3 2 3 INV" line listed in table 1 may be translated to the "INV INV3 (.Z(3), .A(2)):" line listed in table 2. The translation of instance names ("XINV1" to "INV1" in the above example), may employ simple truncation of a leading "x" in element names, or may employ renaming. Renaming may be total or in part and may employ a lookup table, an algorithm, or rules to define the instance name. Advantageously, the present invention allows the hierarchy of the SPICE design and signal name associations to be maintained. The signal node names of the SPICE file may be employed to define wires in Verilog, and to specify signal connections to Verilog circuit elements. As may be observed in table 2, the signal nodes listed in table 1 are defined as wires. The circuit element descriptor may be translated to Verilog syntax. IN the examples of tables 1 and 2, INV is used for both SPICE and Verilog syntax. At step 512, discrete circuit elements, such as resistors, capacitors, transistors, and inductors, for example, are removed. At step 514, the modified file is written out to produce Verilog structured netlist 516.

TABLE 1

EXAMPLE SPICE INPUT

.SUBCKT INV_CHAIN Z A
XINV1 1 A INV
XINV2 2 1 INV
XINV3 3 2 INV
XINV4 4 3 INV
XINV5 Z 4 INV
.ENDS
.SUBCKT INV Z A
MP1 Z A VDD VDD W=1U L=0.25U
MN1 Z A VSS VSS W=0.5U L=0.25U
.ENDS

TABLE 2

EXAMPLE VERILOG OUTPUT module INV_CHAIN (Z, A);
output Z;
input A;
wire 1;
wire 2;
wire 3;

TABLE 2-continued

EXAMPLE VERILOG OUTPUT

```
wire 4;
INV INV1 (.Z(1), .A(A));
INV INV2 (.Z(2), .A(1));
INV INV3 (.Z(3), .A(2));
INV INV4 (.Z(4), .A(3));
INV INV5 (.Z(Z), .A(4));
endmodule
```

The above example is illustrative of one embodiment of the present invention. A Perl code listing of an embodiment of the invention is shown in Appendix A. References to SPICE include any hardware description language compliant with IEEE SPICE standards. The above description need not be implemented in the exact order described. Other methods may be employed to achieve equivalent results. Naming conventions may be employed to simplify the translation process. For example, SPICE files may be formatted such that only input signals begin with the letter "I" and that only output signals begin with the letter "O". Additionally, signals may be more easily identified through predefined delimiters. For example, a plus sign may be used to delimit and indicate input signals and a minus sign may be used to delimit and indicate output signals.

As described, the present invention provides a quick and convenient method that allows a designer to verify the accuracy of conversion of Verilog designs to SPICE, and to convert SPICE designs to Verilog for simulation using Verilog. As previously noted, the translation provided by the present invention also provides greater flexibility in the simulation tools that may be employed.

The foregoing description of the invention has been presented for purposes of illustration and description. It is not intended to be exhaustive or to limit the invention to the precise form disclosed, and other modifications and variations may be possible in light in the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

APPENDIX A

```
#!/user/local/bin/perl
# Copyright © 2001
# LSI Logic, Inc.

# Andy Rankin
# Ph: (970) 206-5107
# email: arankin@sil.com

# Sp2vlog.pl

# Usage: sp2vlog.pl -s spfile [-d dfile] [-h]

#       -s <spfile>     Spice transistor livel file to be
translated (required)
#       -d <dfile>      Data file from vlog2sp.pl containing port
types (defaults to basename.data)
#       -h              prints this message

# ADD CLEANER TO THIS FILE TO GET + SIGNS REMOVED
# ADD SOMETHING TO VLOG2SP TO MAKE SPACE COMPATIBLE
```

APPENDIX A-continued

```
LINE LENGTHS
##############
#  Set Defaults  #
##############
$tech="gflx";
$subckt_lead_string="x";
###############################
#  Parse Command Line Arguments  #
###############################
require "newgetopt.pl";
&NGetOpt("s:s","d:s","h");
if ($opt_h) { &usage; }
if ($opt_s) {
    $spfile=$opt_s;
}
else {
    print("\nERROR: Must specify spice file\n");
    &usage;
}
$basename=`basename $spfile .sp`;
chop($basename);
if ($opt_d) { $dfile =$opt_d; }
else { $dfile=$basename.".data"; }
#########################
#  Open spice and data files  #
#########################
open(INFILE,"$spfile") || die("Unable to open $spfile for
reading: $!\n\n");
@infile=<INFILE>;
close(INFILE);
open(INFILE,"$dfile") || die("Unable to open $dfile for
reading: $!\n\n");
@dfile=<INFILE>;
close(INFILE);
foreach (@infile) {
    @pin_list=( );
    tr/A-Z/a-z/;
    if (/^\s*.subckt\s/) {
        # If the line is a space subckt definition, it is the
same as a module definition in
        # verilog. Split the line to extract the subcircuit
name and pins:
        chop;
        ($foo,$modulue,@subckt_pins)=split(/\s+/);
        @module_pins=&remove_busses(@subckt_pins); # remove
bus notation from subcircuit pins
        $pinlist=join(", ",@module_pins);
        print ("module $module \( $pinlist \);\n"); # print
the verilog module definition line
        # For each pin on the module, determine the port type
from the data file:
        foreach $pin (@module_pine) {
            foreach $port (@dfile) {
                if ($port =~ /$module $pin (\S+)/) {
$port_type=$1; last; }
                else { $port_type=" "; }
            }
            @indices=&consolidate_bus($pin,@subckt_pins); #
If it's a bus, add bus notation
            # Print the input/output definitions with bus
notation as necessary:
            if ($port_type) {
                if (@indices) { print("$port_type
[$indices[$#indices]:$indices[0] $pin\;\n"); }
                else { print("$port_type $pin\;\n"); }
            }
        }
        # Print wire definitions for all the internal signals:
        foreach (@dfile) {
            if (/$module (\S+) wire/) { print("wire $1\;\n"); }
        }
    }
    elsif (/^\s*.ends\s*/) {
        print("endmodule\n\n");
    }
    elsif (/^\s*x\s*/) {
        s/^\s+//;
        s/\s+$//;
```

APPENDIX A-continued

```
        @signal_names=split(/\s+/);
        $instance_name=shift(@signal_names);       # Shift the instance name from front of line
        $instance_name=~s/^$subckt_lead_string//;  # Remove the x from the
        $subckt_name=pop(@signal_names);           # Pop the module name from the end of line
        @signal_names=&clean_signals(@signal_names);
        #grep the spice file for the subcircuit definition;
and extract the pin names;
        ($foo,$foo2,@subck_pins)=split(/\s+/,`grep -i
".SUBCKT $ subckt_name " $spfile`);
        # Verify that the number of signals in the spice subcircuit call matches the number of
            # pins in the spice subcircuit definition:
            if ($#signal_names != $#subckt_pins) {
                die("ERROR: $instance_name $subckt_name number of pins do not match\n\n");
            }
            # Pair up the signal names in the spice subcircuit call with the pin names
            # on the spice subcircuit definition:
            for($i=0;$i<=$#signal_names;$i++) {
                $subckt_pins[$i]=~tr/A-Z/a-z/;
                push(#pin_list,".$subckt_pins[$i]\($signal_names[$i]\)");
            }
            # Join the list of signal/pin pairs and print it with the module instantiation:
            $pin_string=join(", ",@pin_list);
            print("$subckt_name $instance_name ( $pin_string )\;\n");
        }
    }
}
sub usage {
    # This subroutine prints usage information
    print("\nusage: sp2vlog.pl -s spfile [-d dfile] [-hd]\n\n");
    print("\t-s <spfile>\tspice transistor level file to be translated (required)\n");
    print("\t-d <dfile>\tdata file from vlog2sp.pl containing port types (defaults to basename.data)\n");
    print("\t-h\t\tprints this message\n");
    die("\n");
}
sub consolidate_bus {
    # This subroutine finds the indices for a given pin, sorts them, and returns them.
    my($pin,@pins) = @_;
    my(@indices);
    foreach (@pins) {
        if (/$pin\[(\d+)\]/) {
            push(@indices,$1);
        }
    }
    @indices=sort(@indices);
}
sub remove_busses {
    # This subroutine removes bus notation from the pins on the spice subcuit line.
    # It includes each bus as one pin in the pinlist. It returns the pin list.
    my($pinlist) = @_;
    my(@newpinlist);
    foreach (@pinlist) {
        s/\[\d+\]//g;
        if(&element_exists($_,@newpinlist)) { }
        else { push(@newpinlist,$_); }
    }
    return(@newpinlist);
}
sub element_exists {
    # This subroutine checks to see if an element exists in an array.
    my($element,@array)=@_;
    foreach (@array) {
        if ($_ eq $element) { return(1); }
    }
    return(0);
}
sub clean_signals {
    # This subroutine converts vss and vdd signals to verilog logic 0 and logic 1. It also
    # removes dummy pins.
    my(@signals) = @_;
    foreach (@signals) {
        if ($_ eq "vss") { $_ = "1'b0"; }
        if ($_ eq "vdd") { $_ = "1'b1"; }
        if (/^dummy/) { $_ = " "; }
    }
    @signals;
}
```

We claim:

1. A method for designing an integrated circuit comprising:

partitioning a design into a plurality of function blocks;

designing a first one of said plurality of function blocks employing Verilog to produce a first block design;

designing a second one of said plurality of function blocks employing SPICE to produce a second block design;

converting said first block design from Verilog to SPICE to produce a converted first block design comprising a file including a subcircuit name identified by ".SUBCKT" heading, at least one node name, at least one discrete circuit element description, at least one output signal name, and a ".ENDS" statement;

simulating operation of said converted first block design and said second block design; and translating said converted first block design from SPCE to Verilog to produce a translated first block design.

2. The method of claim 1 further comprising:

comparing said translated first block design with said first block design.

3. The method of claim 1 wherein said step of translating further comprises:

changing ".SUBCKT" heading in said converted first block design to "module".

4. The method of claim 1 wherein said step of translating further comprises:

changing ".ENDS" statements in said converted first block design netlist to "endmodule".

5. The method of claim 1 wherein said step of translating further comprises:

deleting said at least one discrete circuit element description in said converted first block design.

6. The method of claim 1 wherein said step of translating further comprises:

defining a wire name corresponding to said at least one node name in said converted first block design.

7. The method of claim 1 wherein said step of translating further comprises:

identifying said at least one output signal name in said converted first block design and defining a Verilog output signal using said output signal name.

8. The method of claim 1 wherein said step of translating further comprises:

identifying a subcircuit name.

9. The method of claim 8 wherein said step of translating further comprises:

employing said subcircuit name as a module name.

10. An integrated circuit produced by the steps of:

partitioning a design into a plurality of function blocks;

designing a first one of said plurality of function blocks employing Verilog to produce a first block design;

designing a second one of said plurality of function blocks employing SPICE to produce a second block design;

converting said first block design from Verilog to SPICE to produce a converted first block design comparing a file including a subcircuit name identified by a ".SUBCKT" heading, at least one node name, at least one discrete circuit element description, at least one output signal name, and a ".ENDS" statement;

simulating operation of said converted first block design and said second block design; and translating said converted first block design to Verilog to produce a translated first block design.

11. The integrated circuit of claim 10 further comprising:

comparing said translated first block design with said first block design.

12. The integrated circuit of claim 10 wherein said step of translating further comprises:

changing said ".SUBCKT" heading in said converted first block design to "module".

13. The integrated circuit of claim 10 wherein said step of translating further comprises:

changing said ".ENDS" statement in said converted first block design to "endmodule".

14. The integrated circuit of claim 10 wherein said step of translating further comprises:

deleting a discrete circuit element description in said converted first block design.

15. The integrated circuit of claim 10 wherein said step of translating further comprises:

defining a Verilog wire name corresponding to said at least one node name in said converted first block design.

16. The integrated circuit of claim 10 wherein said step of translating further comprises:

identifying said at least one output signal name in said converted first block design and defining a Verilog output signal using said output signal name.

17. The integrated circuit of claim 10 wherein said step of translating further comprises:

identifying said subcircuit.

18. The integrated circuit of claim 17 wherein said step of translating further comprises:

employing said subcircuit name as a module name.

* * * * *